(12) United States Patent
Bjorklund et al.

(10) Patent No.: US 6,707,534 B2
(45) Date of Patent: Mar. 16, 2004

(54) MASKLESS CONFORMABLE LITHOGRAPHY

(75) Inventors: Gary C. Bjorklund, Los Altos, CA (US); Kanti Jain, Hawthorne, NY (US)

(73) Assignee: Anvik Corporation, Hawthorne, NY (US)

( * ) Notice: Subject to any disclaimer, the term of this patent is extended or adjusted under 35 U.S.C. 154(b) by 0 days.

(21) Appl. No.: 10/142,818

(22) Filed: May 10, 2002

(65) Prior Publication Data
US 2003/0210383 A1 Nov. 13, 2003

(51) Int. Cl.[7] ............................. G03B 27/42; G03B 27/62
(52) U.S. Cl. ............................................... 355/53; 355/47
(58) Field of Search ....................... 355/53, 47, 67–71; 250/492.1, 492.2; 359/224, 291, 855, 318

(56) References Cited

U.S. PATENT DOCUMENTS

| | | | |
|---|---|---|---|
| 6,304,316 B1 * | 10/2001 | Jain et al. | 355/53 |
| 6,416,908 B1 * | 7/2002 | Klosner et al. | 430/5 |
| 6,473,237 B2 * | 10/2002 | Mei | 359/619 |
| 6,504,644 B1 * | 1/2003 | Sandstrom | 359/291 |
| 6,529,262 B1 * | 3/2003 | Mei et al. | 355/47 |

* cited by examiner

Primary Examiner—Henry Hung Nguyen
(74) Attorney, Agent, or Firm—Carl C. Kling (57) ABSTRACT

Maskless patterning of high-resolution microelectronics features onto large curved substrates. A computer controls individual pixel elements in a spatial light modulator array (SLM) which provides the pattern. Maintaining optical track length constant is by software control of SLM vertical positioning, surface configuration and tilt. SLMs are on/off devices, either reflective or transmissive, such as digital micromirror devices (DMD) and liquid crystal light modulator arrays (LCLM). High-resolution spatial light modulator arrays currently have no capacity for changing or control of their average surface configurations. It is proposed to segment the SLM into smaller array chips, each mounted on a vertical positioner, such as a piezo-actuator, to provide the desired configuration to the surface defined by the spatial light modulator arrays. As an additional means to accommodate the variable surface configuration of the curved surface, a flexmirror (adaptive mirror) may be inserted between projection lens subsystem and the SLM array, defining the wavefront of pixel sub-beams striking the surface of the substrate and enabling the optical conjugates to be kept constant for a greater range of substrate curvatures.

9 Claims, 7 Drawing Sheets

MASKLESS CONFORMABLE LITHOGRAPHY

BACKGROUND OF THE INVENTION

1. Field of the Invention

This invention relates to microlithography, and more specifically relates to maskless patterning of high-resolution microelectronics features on large-area curved substrates.

2. Description of Related Art

Microelectronics patterning on large substrates, and microelectronics patterning on curved substrates, and microelectronics patterning using maskless techniques, are all the subjects of patents and products of the Anvik Corporation. Large area lithography techniques developed by Anvik Corporation generally use a mask and substrate mounted on the same high-precision positioning stage, combined with imaging through a folded projection system and exposure with partially overlapping, complementary-illumination scans, so that the patterning exposure is seamless over the large area. See, for example, U.S. Pat. No. 5,285,236, issued Feb. 8, 1994, Ser. No. 07/954,662, filed Sep. 30, 1992, LARGE-AREA, HIGH-THROUGHPUT, HIGH-RESOLUTION PROJECTION IMAGING SYSTEM, K. Jain.

Maskless lithography techniques developed by Anvik Corporation generally use a programmable spatial light modulator array to produce the pattern, instead of using a mask. See, for example, U.S. Pat. No. 6,312,134, issued Nov. 6, 2001, SEAMLESS, MASKLESS LITHOGRAPHY SYSTEM USING SPATIAL LIGHT MODULATOR ARRAY, Ser. No. 09/230,438, filed Jul. 25, 1996, K. Jain, T. J. Dunn & J. M. Hoffman.

Lithography techniques developed by Anvik Corporation for patterning on curved substrates generally require vertical motion of the mask and/or substrate so as to maintain the light beam path length constant between the mask and substrate. See, for example, U.S. Pat. No. 6,304,316, issued Oct. 16, 2001, K. Jain, N. O. Farmiga & T. J. Dunn, MICROLITHOGRAPHY SYSTEM FOR HIGH-RESOLUTION LARGE-AREA PATTERNING ON CURVED SURFACES, Ser. No. 09/176,920, filed Oct. 22, 1998.

No lithography technology for maskless patterning of high-resolution features on large curved surfaces has been reported to-date. The reason may possibly be that the large-area lithography techniques, the maskless lithography techniques, and the curved-substrate lithography techniques are all difficult to design and build, and because there is no simple way to combine the techniques while maintaining proper optical conjugates and other imaging characteristics. This invention presents solutions to the problem of maskless patterning on a large-area curved substrate with high throughput.

SUMMARY OF THE INVENTION

It is the object of the invention to provide a novel system of maskless patterning of a large curved microelectronics substrate at high resolution with high throughputs.

Another object of the invention is to maintain high resolution of image, even though substrate curvature may tend to vary the light beam path length between the spatial light modulator array and the substrate, creating optical variations which can affect feature quality.

A feature of the invention is the use of a 2-D spatial light modulator array which is movable in both translation and tilt, and a movable projection lens system to keep the total light beam length constant while maintaining focus.

Another feature of the invention is the use of a segmented spatial light modulator array array with each segment on its own axial positioner, to match the averaged spatial light modulator array surface profile with the local curvature of the substrate.

An advantage of the invention is that the system can be conformed to known deliberate curvature of the substrate and also can accommodate to random substrate anomalies of curvature, including edges.

Another advantage of the invention is that the composite system is capable of high resolution in very small production runs, even with randomly curved substrates.

Still another advantage of the invention is that maskless patterning on curved surfaces may be accomplished by additional elements mounted outside the optical path, using optical elements present in the optical path of a common system—thus being subject to retrofit or economical new manufacture.

Other objects, features and advantages of the invention will be apparent from the following written description, claims, abstract and the annexed drawings.

DESCRIPTION OF THE PREFERRED EMBODIMENTS

General Considerations

The overarching problem to be solved is to keep each pixel in the projected image of the spatial light modulator in focus on and in perfect registration with the three dimensionally curved surface of the substrate. Since for doubly telecentric imaging, the projected image is always formed at a constant optical track length distance from the object, perfect imaging would require that the optical track length between every pixel in the spatial light modulator array and its corresponding target location on the surface of the substrate be the same constant value.

Clearly, this constant optical track length condition cannot be perfectly accomplished over the entire curved substrate surface, since the spatial light modulator surface is a flat 2-D plane (or consists of a multiple flat planar segments). However, in the case where the transverse extent of the image of the spatial light modulator array is small compared to the minimum radius of curvature of the substrate surface, the constant optical track length condition can be approximated to a high degree of precision by translating in the z direction and tilting the spatial light modulator as the image is scanned in the x-y directions over the surface of the substrate. Alternatively, the substrate itself can be tilted and translated in the z direction during the scan. The degree of precision that is accomplished is well within the depth of focus tolerances necessary for high quality imaging for lithographic and patterning applications.

There is a hierarchy of succeedingly more accurate corrections that can be implemented to approximate the constant optical track length condition. The first-order correction corresponds to simple translation of the spatial light modulator in the z direction. In this case a constant optical track length can be maintained between the center of the spatial light modulator and the substrate surface during the scan. Obviously, however, the optical track length will be different for the pixels near the edges of the spatial light modulator, with the potential for image degradation. The second-order correction corresponds to a tilting of the spatial light modulator in addition to translation. In the case a constant optical track length can be maintained between the center of the spatial light modulator and the substrate surface, while at the same time the angle of the spatial light modulator plane can be adjusted to be parallel with the tangent to the substrate surface. This greatly reduces the optical track length error for the pixels at the edges of the spatial light modulator. However, it does not correct for residual error due to local curvature of the substrate surface. The third-order correction corresponds to an adjustment of the wavefront of the light forming the image on the substrate. This adjustment can be accomplished using an adaptive mirror in the beam path between the spatial light modulator and the substrate surface or be deforming the surface of the spatial light modulator itself. In this case a constant optical path length can be maintained between the center of the spatial light modulator and the substrate surface, the spatial light modulator plane can be adjusted to be parallel with the tangent to the surface substrate, and the error due to local curvature can be corrected.

The second-order correction, corresponding to the approximation of the tilted planar image surface to the curved substrate surface is surprisingly accurate for cases where the image size is small compared to the radius of curvature. Large image sizes on the order of millimeters can be accommodated with necessary depth of focus as small as 5 microns, making possible efficient parallel exposure of greater than $10^6$ pixels with micron-scale transverse resolution.

Consider the case of a demagnified image of a planar SLM projected on a spherical surface with radius of curvature R. Let d be the size of the demagnified image. Given optimum positioning of this image parallel to the tangent to the surface, the unavoidable deviation x between the square planar surface and the spherical surface is given by the formula $$x = d^2/16R,$$

where it is assumed that d<<R. The deviation x is a measure of the depth of focus required to achieve good imaging on the spherical surface.

In the table below, a few numerical examples are worked out. It can be seen that for R=10 cm, a depth of focus of 10 microns is sufficient to permit good imaging for d as large as 4 mm. For a depth of focus of 5 microns, corresponding to a transverse resolution of 1 micron, d can be as large as 2.8 mm. This corresponds to a field of $7.8 \times 10^6$ pixels. For R=5 cm, a depth of focus of 5 microns is sufficient for d as large as 2.0 mm. Even for the extreme case of R=1 cm, corresponding roughly to the surface of a golf ball, a depth of focus of 5 microns is sufficient for d as large as 0.89 mm.

| R (cm) | d (mm) | d/R | x/R | x (microns) |
|---|---|---|---|---|
| 10.00 | 10.00 | 0.100000 | 0.000625 | 62.50 |
| 10.00 | 6.32 | 0.063240 | 0.000250 | 25.00 |
| 10.00 | 5.00 | 0.050000 | 0.000156 | 15.63 |
| 10.00 | 4.00 | 0.040000 | 0.000100 | 10.00 |
| 10.00 | 2.83 | 0.028280 | 0.000050 | 5.00 |
| 10.00 | 2.00 | 0.020000 | 0.000025 | 2.50 |
| 10.00 | 1.27 | 0.012650 | 0.000010 | 1.00 |
| 10.00 | 1.00 | 0.010000 | 0.000006 | 0.63 |
| 5.00 | 10.00 | 0.200000 | 0.002500 | 125.00 |
| 5.00 | 6.32 | 0.126490 | 0.001000 | 50.00 |
| 5.00 | 5.00 | 0.100000 | 0.000625 | 31.25 |
| 5.00 | 4.47 | 0.089440 | 0.000500 | 25.00 |
| 5.00 | 4.00 | 0.080000 | 0.000400 | 20.00 |
| 5.00 | 2.83 | 0.056560 | 0.000200 | 10.00 |
| 5.00 | 2.00 | 0.040000 | 0.000100 | 5.00 |
| 5.00 | 1.50 | 0.030000 | 0.000056 | 2.81 |
| 5.00 | 1.41 | 0.028260 | 0.000050 | 2.50 |
| 5.00 | 1.27 | 0.025300 | 0.000040 | 2.00 |
| 5.00 | 1.00 | 0.020000 | 0.000025 | 1.25 |
| 5.00 | 0.90 | 0.017900 | 0.000020 | 1.00 |
| 2.00 | 10.00 | 0.500000 | 0.015625 | 312.50 |
| 2.00 | 5.00 | 0.250000 | 0.003906 | 78.13 |
| 2.00 | 4.00 | 0.200000 | 0.002500 | 50.00 |
| 2.00 | 2.83 | 0.141425 | 0.001250 | 25.00 |
| 2.00 | 2.53 | 0.126500 | 0.001000 | 20.00 |
| 2.00 | 2.00 | 0.100000 | 0.000625 | 12.50 |
| 2.00 | 1.79 | 0.089450 | 0.000500 | 10.00 |
| 2.00 | 1.27 | 0.063250 | 0.000250 | 5.00 |
| 2.00 | 1.00 | 0.050000 | 0.000156 | 3.13 |
| 2.00 | 0.80 | 0.040000 | 0.000100 | 2.00 |
| 2.00 | 0.57 | 0.028350 | 0.000050 | 1.00 |
| 1.00 | 5.00 | 0.500000 | 0.015625 | 156.25 |
| 1.00 | 2.83 | 0.282850 | 0.005000 | 50.00 |
| 1.00 | 2.00 | 0.200000 | 0.002500 | 25.00 |
| 1.00 | 1.79 | 0.178900 | 0.002000 | 20.00 |
| 1.00 | 1.27 | 0.126500 | 0.001000 | 10.00 |
| 1.00 | 1.00 | 0.100000 | 0.000625 | 6.25 |
| 1.00 | 0.89 | 0.089400 | 0.000500 | 5.00 |
| 1.00 | 0.57 | 0.056600 | 0.000200 | 2.00 |
| 1.00 | 0.50 | 0.050000 | 0.000156 | 1.56 |
| 1.00 | 0.40 | 0.040000 | 0.000100 | 1.00 |

Translation Stage for Transmissive Spatial Light Modulator Array

Figure 1:
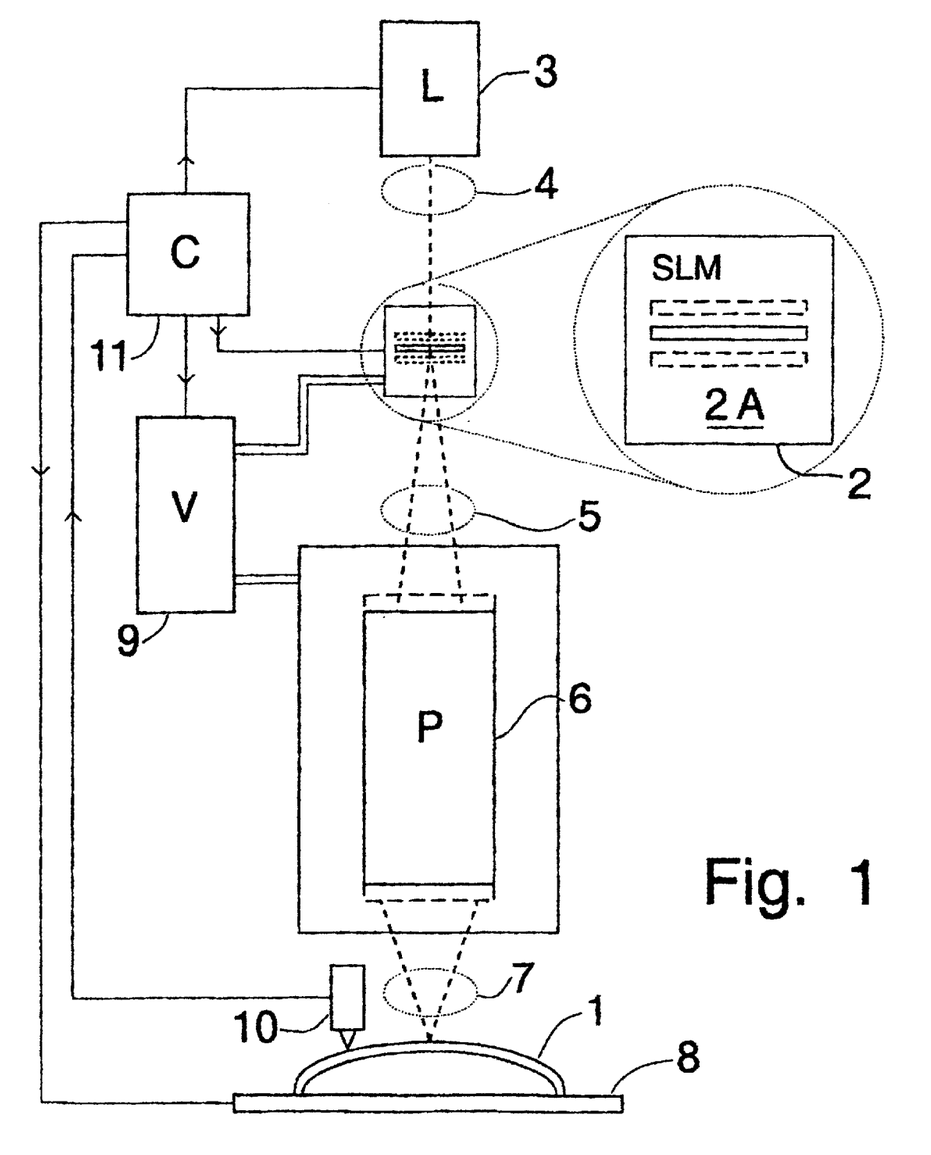
FIG. 1 is an elevation view of the preferred embodiment in use, with linear vertical positioning of transmissive spatial light modulator array and projection optics.

FIG. 1 shows the invention in use in a preferred embodiment, in which the optical track length is corrected to first-order to be constant from the 2-D pixel array of the spatial light modulator to the three-dimensionally curved substrate surface. The desire is to provide high-resolution features on curved substrate 1, using a transmissive spatial light modulator array 2 as a virtual mask, and maintaining optical track length constant despite the curvature of the substrate. The patterning radiation energy is a pulsed light beam provided by illumination subsystem 3. The pulsed light beam 4 is modified by the pixel elements of spatial light modulator array 2, with featurized light beam 5 passing through lens system 6 and emerging as imaging patterning beam 7. Lens system 6 images the spatial light modulator array pixels on the substrate 1, and may have a reduction ratio from 1:1 to 50:1, or even greater, depending upon the desired resolution. Patterning beam 7 impinges on the surface of substrate 1, which is photosensitive and thus patternable to the image (or reverse image, depending on type of photo-active material) of the pixel array pattern from the spatial light modulator array 2. Substrate 1 rides on stage 8, which provides x-y scanning motion. The pattern is preferably exposed by a sequence of hexagonal arrays of pixels in rows and columns, with the hexagons overlapping so as to provide constant illumination intensity and seamless presentation of feature patterns over the entire surface of the substrate.

As the scan progresses, the position in space of the image area on the surface of substrate 1 changes because of the curvature of substrate 1. A constant optical track length between the center of the spatial light modulator array 2 and the substrate surface can be achieved by changing the position of the spatial light modulator array 2 a vertical distance (in the z direction) corresponding to the vertical distance moved by the surface of the curved substrate. This change may be accommodated by changing the position of the lens subsystem 6, essentially by moving lens subsystem 6 a vertical distance corresponding to the vertical distance moved by the surface of the curved substrate, to maintain the light beam track distance constant. It is also necessary to move the lens subsystem 6 simultaneously and by a corresponding amount. This can be accomplished by mounting both the spatial light modulator array 2 and the lens subsystem 6 on the same vertical stage 9.

Note that the embodiment of FIG. 1 is shown as an in-line optical system. An in-line optical system may provide for reduction of any magnitude, for example in the ratio range 1:1 to 50:1. If the optical system selected should be of a folded configuration, with mask and substrate carried on the same stage platform, a reverser may be required, and appropriate motions to the projection lens system and to the spatial light modulator array 2 may be required to maintain focus and optical track length.

Since the output beam of illumination subsystem 3 is collimated, its distance from spatial light modulator array 2 is essentially immaterial so long as its output remains substantially collimated and relatively concentrated. The patterning operation, however, requires that the radiation beam be homogenized by a homogenizer in the optical path. Once homogenized, the track length and other parameters of the radiation beam need to be maintained constant. Surface profilometer 10, which preferably is a non-contact device using light at a wavelength which does not affect the substrate 1, is used to provide dynamic data on the position in space of the area to be imaged on of the curved substrate. Control computer 11 adds a time dimension by storing multiple position data to determine the position in space of a plane tangential to the substrate surface, and may calculate the tilt of a depth-of-focus volume about the tangential plane. Computer 11 thus controls positioning motions of stages 8 and 9 and pulse output of illumination subsystem 3 to provide appropriate pixel exposures for seamless patterning of the substrate.

In operation, a substrate 1 is mounted on the x-y scanning stage 8, presenting for patterning a large area substrate surface with a multi-pixel image field. The multi-pixel image field has pixel positions arranged in an array of columns and rows like a checkerboard, with each location being an available pixel position. Each pixel position may be selected or unselected. The selected pixel positions receive exposure to form the patterns to build the microelectronics features, which include circuit connections or devices. The substrate surface is scanned by a sequence of laser pulse flashes, each providing a multi-pixel image pattern which is a small fraction of the total area. The different multi-pixel image pattern flashes overlap so as to cover the entire area with equal-intensity feature patterns amounting to a seamless total substrate pattern. Control computer 11 initiates a preliminary scan, monitoring the position in space of the curved surface of substrate 1. Control computer 11 positions lens subsystem 6 and spatial light modulator array 2 to maintain constant optical track length and conjugates. There is no need to move illumination subsystem 3, unless the illumination subsystem 3 includes a significant modification of the laser beam such as by a uniformizing homogenizer. During the scan, stage 8 moves the curved substrate 1 in an x-y plane while the projection subsystem 6 and the spatial light modulator array 2 ride up and down as the substrate 1 surface rises and falls.

Some details of the illumination subsystem 3, the virtual mask 2 and the projection subsystem 6, which with other elements may form a detailed embodiment, are as follows:

(a) said illumination subsystem 3 has an effective source plane in the shape of a regular hexagon, and illuminates a regular-hexagon-shaped region on said mask 2 and (b) said regular-hexagon-shaped illumination region on the virtual mask 2 is so oriented that two of its six sides are perpendicular to the scan direction;

(c) said projection subsystem 6 has an image field in the shape of a regular hexagon, and said regular-hexagon-shaped image field is so oriented that two of its six sides are perpendicular to the scan direction; and (d) the effective width, w, of each scan, as defined by the lateral separation between the center lines of two adjacent scans, is given by $$w=1.5l_h,$$

where $l_h$ is the length of each side of said regular-hexagon-shaped illuminated region on the substrate 1.

Multi-Altitude Gimbal Mounting for Transmissive Spatial Light Modulator Array

Figure 2:
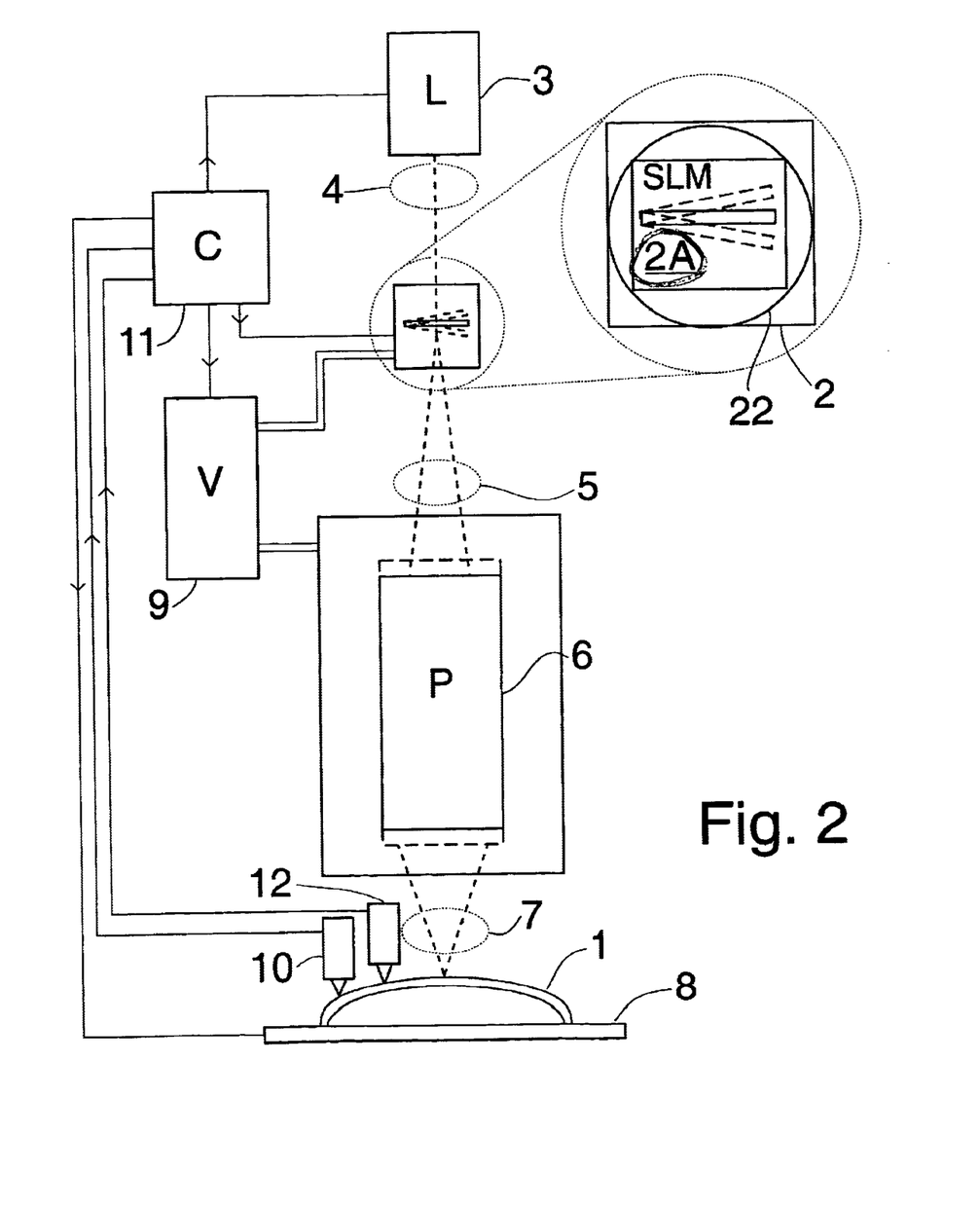
FIG. 2 is an elevation view of a second preferred embodiment in use, which combines linear positioning with provision for rotationally adjusting the tilt angle of the transmissive spatial light modulator array to match the momentary tangential plane of the substrate surface at the image area.

FIG. 2 shows a modified embodiment in which the optical track length is corrected to second-order to be constant from the 2-D pixel array of the spatial light modulator to the tree-dimensionally curved substrate surface. Here the transmissive spatial light modulator 2 is mounted on an added tilt gimbal 22, to match the tilt of the plane tangent to the local surface curvature of the curved substrate 1. Most system elements in this embodiment remain the same as in the embodiment of FIG. 1, but there is added complexity to the profile monitoring, essentially by adding at least a second profilometer 12. The added tilt gimbal 22 is mounted on translating stage 9. The problem being solved is that pixel positions at the edges of an image field have a positional increment which amounts to a track length variation from the track length at the central pixel position, sufficient to cause image blurring. This problem is solved by maintaining both the central pixel optical track length (average track length) and an edge pixel optical track length, in which there is an attitude increment to the optical track length. This is accomplished by rotationally positioning the spatial light modulator array 2 for tilt to match the tilt position of the momentary tangential plane to the local curvature of the surface of the curved substrate 1.

Figure 3:
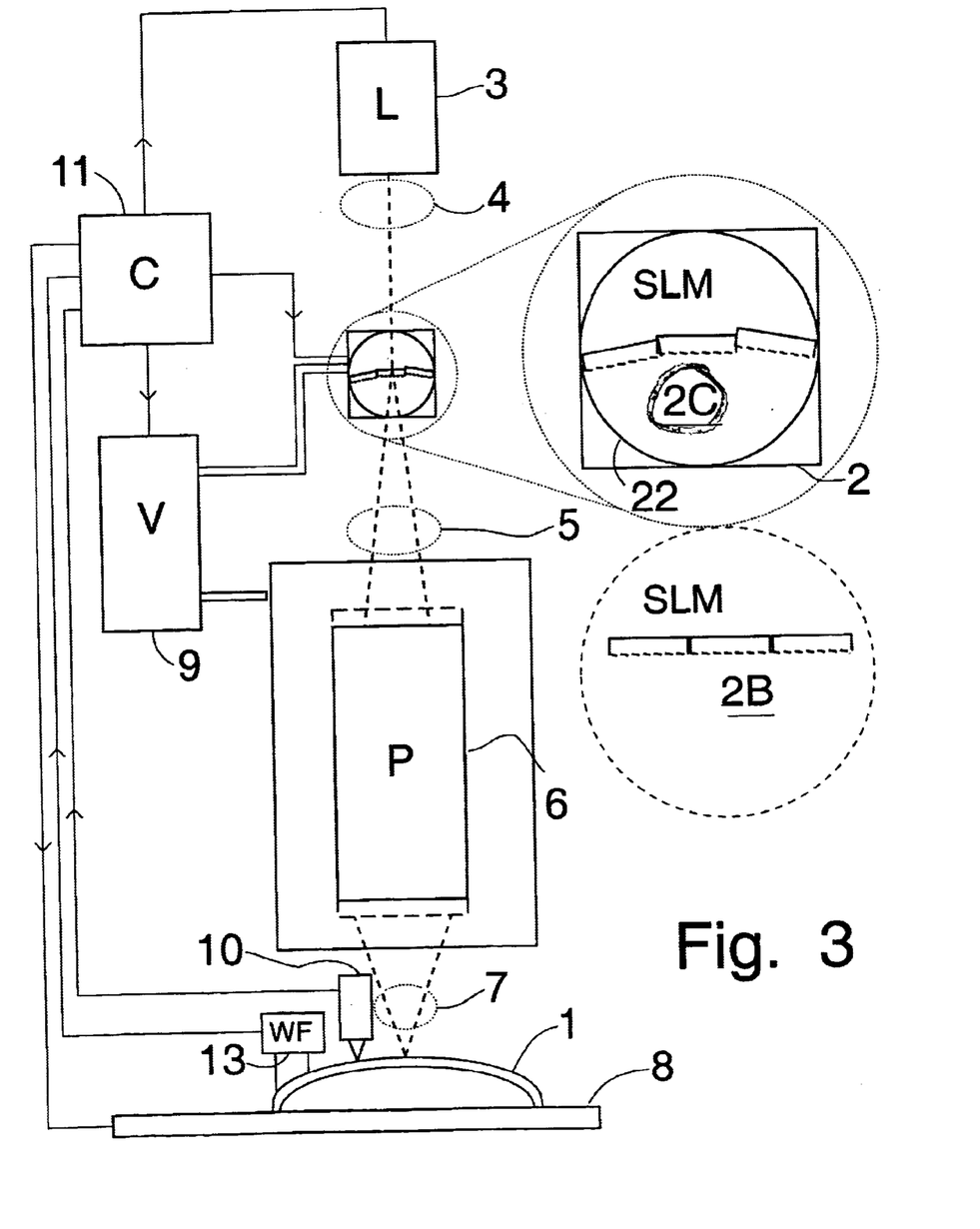
FIG. 3 is an elevation view of a third preferred embodiment in use, with provision for a segmented transmissive spatial light modulator array matching a complex surface image area on the substrate.

Segmented Transmissive Spatial Light Modulator Array in Multi-Altitude Gimbal Mounting FIG. 3 shows a modified embodiment in which the optical path length is corrected a to third-order to be constant from the 2-D pixel array of the spatial light modulator to the three-dimensionally curved substrate surface. Here the transmissive spatial light modulator array 2C is not only mounted on an added tilt gimbal 22, to match the approximated tilt of the momentary tangential plane to the the local curvature of the surface of the curved substrate 1, but also is segmented in such a way as to allow step-wise deformation of its surface profile and hence to provide a capability for adjustment of the emerging optical wavefront emerging to match a more complex substrate surface configuration. Most elements in this configuration remain the same as before, but there is added complexity to the profile monitoring, essentially by adding a wavefront sensor 13. The tilt gimbal 22, mounted on translating stage 9, holds configurable spatial light modulator array 2C. The problem being solved is that residual error from local substrate surface curvature causes the optical track length between the spatial light modulator and the substrate surface to deviate from a constant value. This track length increment may be sufficient to cause blurring. The problem is solved by deforming the surface of the segmented transmissive spatial light modulator in such a way as to correct the wavefront of the image forming light to produce an image surface that is curved to match the substrate local curvature. This deformation is accomplished using arrays of electrically actuated transducers operating under computer control using standard adaptive optics algorithms to process surface local curvature data from the optical wavefront sensor 13.

Flexmirror with Offset Laser and Gimbal Mounted Transmissive SLM Array

Figure 4:
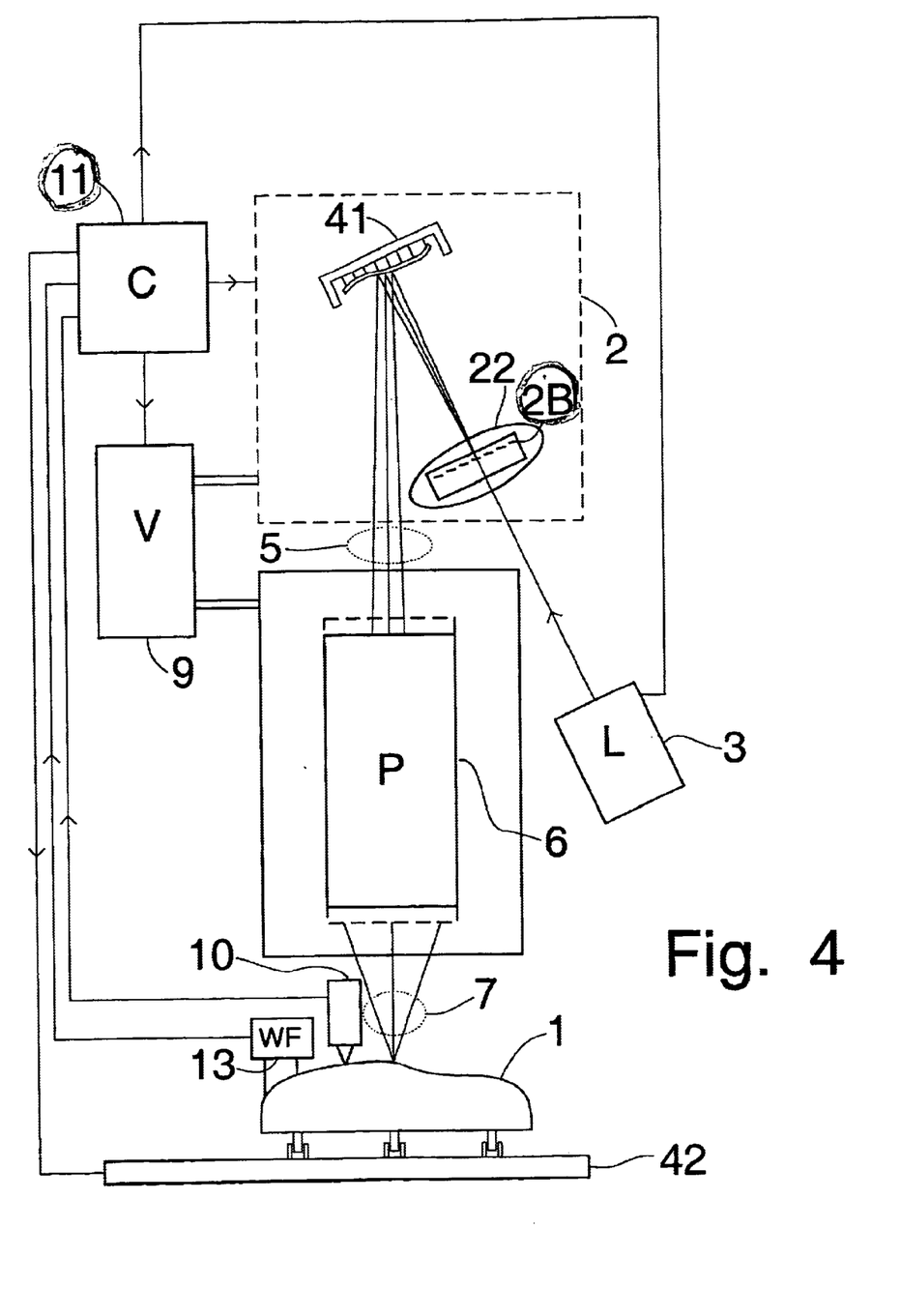
FIG. 4 is an elevation view of a fourth preferred embodiment in use, with illumination subsystem off-axis, and with provision for a flexible reflective mirror whose surface configuration can be adjusted to control the wavefront of the light impinging on the substrate.

FIG. 4 shows a different modified embodiment in which the optical path length is corrected to third-order to be constant from the 2-D pixel array of the spatial light modulator to the three-dimensionally curved substrate surface. Here the transmissive spatial light modulator array 2 is not segmented and is mounted in tilt gimbal 22 in the same way as in the embodiment of FIG. 2. Added flexmirror (adaptive mirror) 41 is used both as a fold mirror and as a wavefront control element. The problem being solved is the same as for the previous embodiment—residual error from local substrate surface curvature causes the optical track length between the spatial light modulator and the substrate surface to deviate from a constant value. The problem is solved by deforming the surface of the adaptive mirror 41 in such a way as to correct the wavefront of the image forming light to produce an image surface that is curved to match the substrate local curvature. This deformation is accomplished using arrays of electrically actuated transducers operating under computer control using standard adaptive optics algorithms to process surface local curvature data from the optical wavefront sensor 13.

Flexmirror with Offset Laser and Reflective SLM Array

Figure 5:
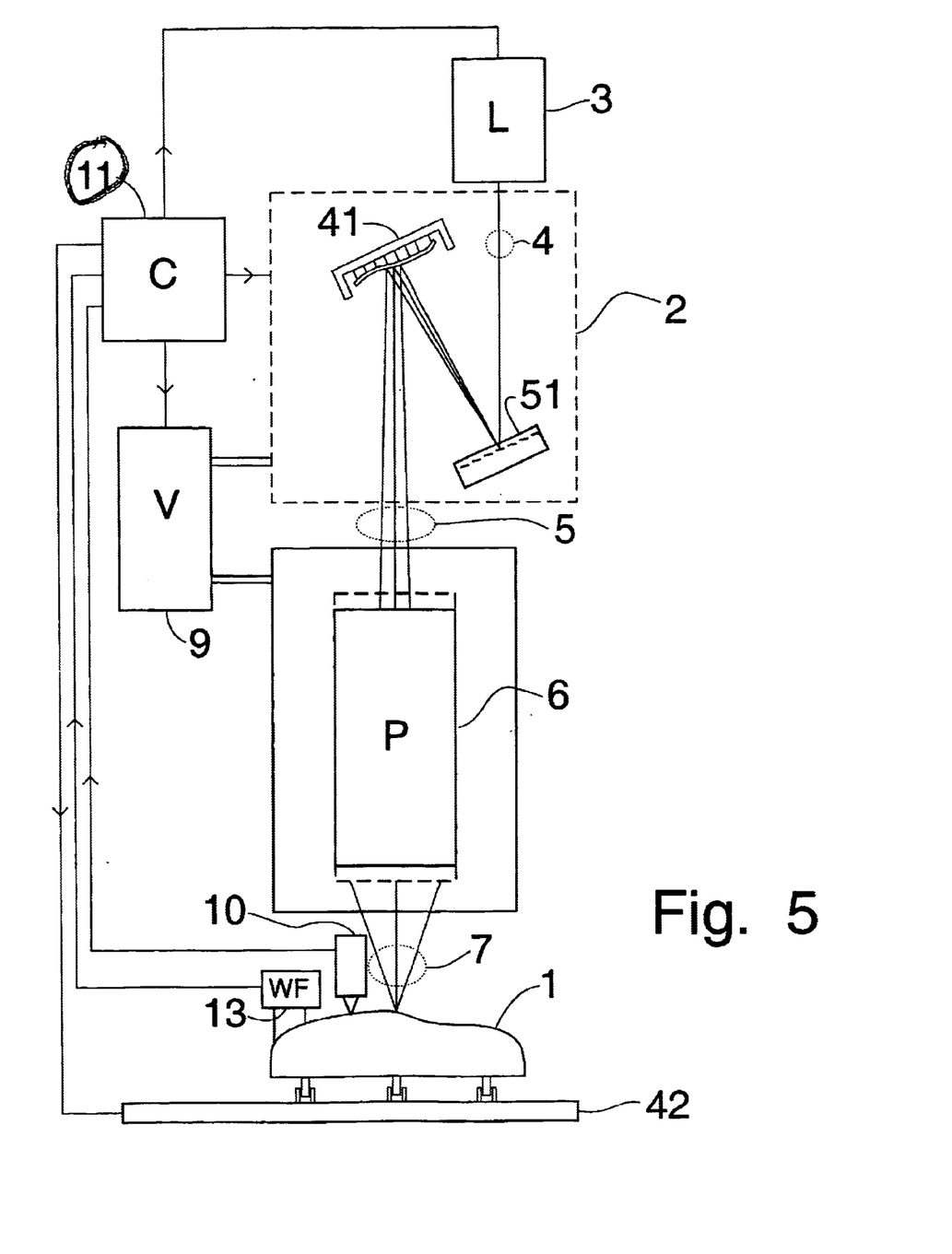
FIG. 5 is an elevation view of a fifth preferred embodiment in use, with illumination system off-axis, and with provision for use of a reflective spatial light modulator in place of a transmissive spatial light modulator.

FIG. 5 shows another different modified embodiment in which the optical path length is corrected to third-order to be constant from the 2-D pixel array of the spatial light modulator to the three-dimensionally curved substrate surface. Here a reflective spatial light modulator array 51 is used. The reflective spatial light modulator array is not segmented and is fixed in space. It is not mounted on a translation stare or gimbal mount. The flexmirror (adaptive mirror) 41 is used both as a fold mirror and as a wavefront control element. The substrate is mounted in a translation stage 42 that in addition to x-y scanning provides the capability of vertical translation in the z direction and the capability of tilting the substrate. First-order correction is accomplished by vertical translation of the substrate and second-order correction is accomplished by tilt of the substrate. Third-order correction is accomplished in the same way as for the previous embodiment.

Segmented Reflective SLM Array with Offset Laser

Figure 6:
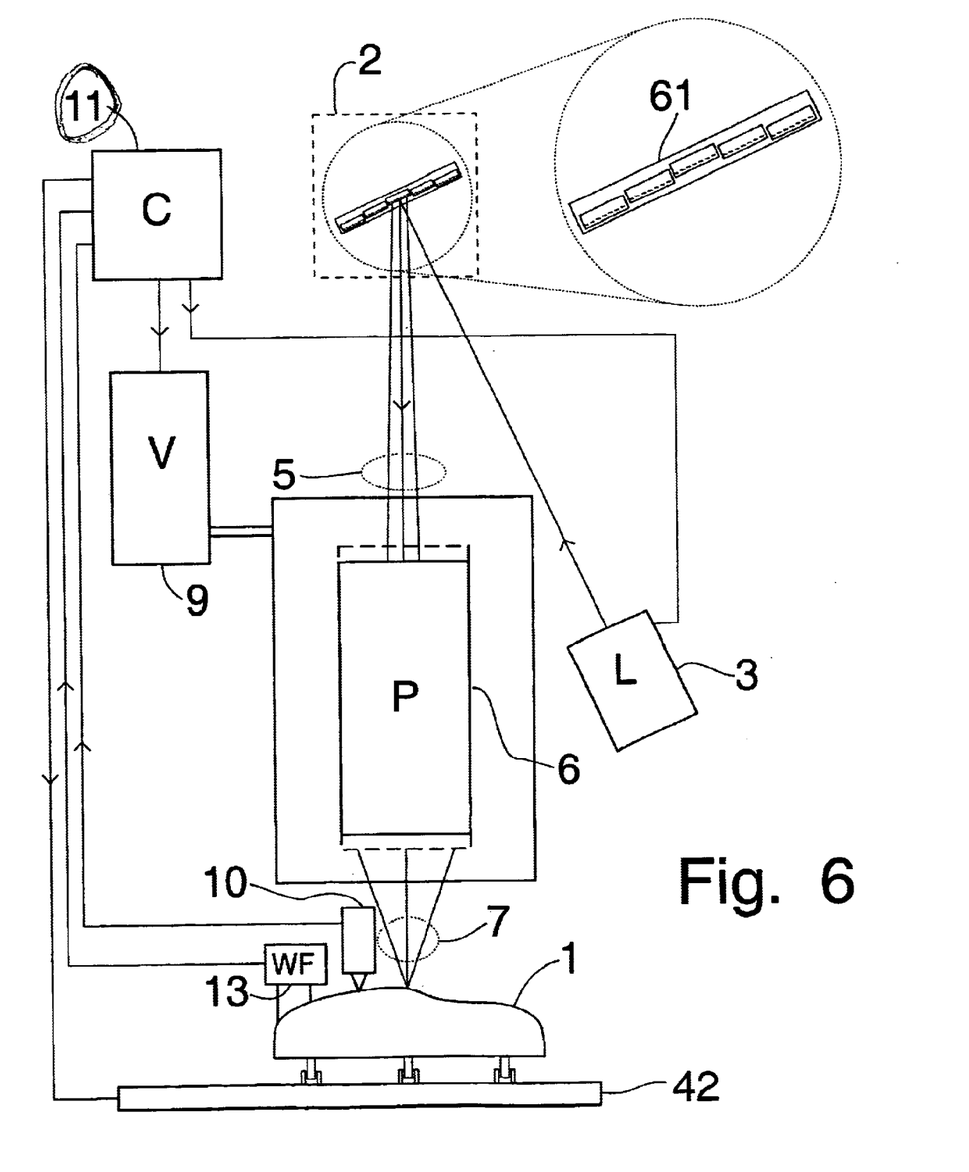
FIG. 6 is an elevation view of a sixth preferred embodiment in use, with illumination system off-axis, and with provision for use of a segmented reflective spatial light modulator array in place of a flexible reflective mirror.

FIG. 6 shows another different modified embodiment in which the optical path length is corrected to third-order to be constant from the 2-D pixel array of the spatial light modulator to the three-dimensionally curved substrate surface. Here a segmented reflective spatial light modulator array 61 is used. The reflective spatial light modulator array 61 is fixed in space. It is not mounted on a translation stare or gimbal mount. The reflective spatial light modulator array 61 is used simultaneously as a fold mirror, as a spatial light modulator, and as a wavefront control element. The substrate is mounted in a translation stage 42 that in addition to x-y scanning provides the capability of vertical translation in the z direction and the capability of tilting the substrate. First-order, second-order, and third-order corrections are accomplished in the same way as for the previous embodiment.

Segmented, Reflective Digital Micromirror Device

Figure 7:
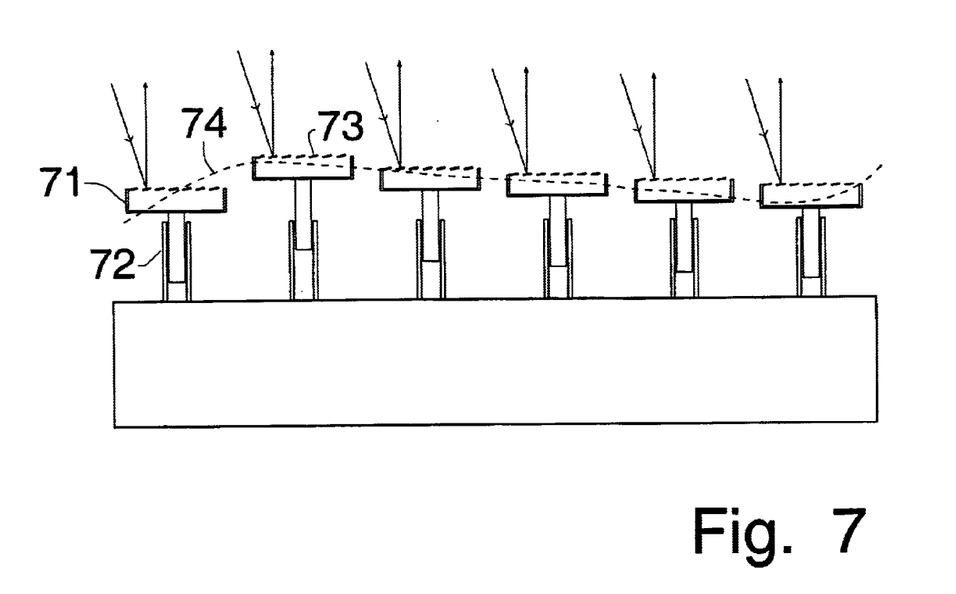
FIG. 7 is an enlarged elevation view of a segmented reflective spatial light modulator array, such as a segmented digital micromirror device, with each segment arranged for producing a desired wavefront of the reflected light.

FIG. 7 is a detail of a height variable segmented digital micromirror device reflective spatial light modulator array 61. Each segment 71 is mounted on a extendable piezoelectric pedestal 72 arranged to raise or lower the related segment of the digital micromirror device. Each segment contains a sub-array of operational digital micromirror devices 73. Each micromirror device can be independently switched between two states—an "on" state where incident light is reflected into the input aperture of the image forming lens system and an "off" state where incident light is reflected outside of this aperture. In this regard each of the micromirror devices can operate as one pixel of digital spatial light modulator. In addition, the wavefront of the "on" state reflected light can be controlled by adjusting the heights of the various segments of the device, since the optical track length depends on the mirror position. As shown in the figure, the desired wavefront shown by dashed line 74 can be approximated in step-wise manner by suitable adjustment of the segment heights. Thus this segmented digital micromirror device combines in a single device the functions of spatial light modulation and wavefront control.

Depth of Focus

To achieve the highest resolution, it is necessary to monitor the position of the SLM elements so that the substrate surface remains within the depth of focus range surrounding the plane tangent to the substrate surface at the image area. Such adjustment may be either general or dynamic with respect to the position of the substrate surface in space. This can sometimes be done by maneuvering the projection lens subassembly vertically, with finer adjustment by tuning the wavelength of the laser output. These expedients, which have been previously disclosed in the Anvik patents mentioned in the prior art section above, are especially useful here because of the limited SLM-element height variation available from piezoelectric actuators in spatial light modulator arrays without altering the plane of the micromirrors.

While the invention has been shown and described in the context of maskless patterning of a substrate using spatial light modulators as virtual masks, it is clear that the alternative embodiments shown, plus other changes in form and detail, may be made without departing from the spirit of the invention, as defined in the following claims.

We claim:

1. A conformable, high-resolution, maskless microlithography system for providing patterns from a virtual mask (2)

onto a large-area photosensitive substrate (1) having a nonplanar surface, characterized by (a) a stage subsystem (8) for the substrate (1), said stage subsystem (8) being capable of scanning in one dimension, and when not scanning in that dimension, capable of moving laterally in a direction perpendicular to the scan direction so as to position itself for another scan; said stage subsystem (8) thus being capable of exposing the full substrate (1) by breaking up the substrate area into a certain number of parallel strips, and exposing each of said strips by scanning the length of the strip across an illumination region;

(b) an illumination subsystem (3) having the wavelength and intensity distribution characteristics suited for exposure of an image field on said substrate (1), having an effective source plane of a predetermined shape, and capable of illuminating through a projection subsystem an image field of said predetermined shape on said substrate (1);

(c) a projection subsystem (6) for imaging said illuminated region of said predetermined shape onto the substrate, having a predetermined object-to-image magnification ratio, having the desired imaging and having an image field of said predetermined shape and of an area smaller than the substrate (1) area;

(d) a spatial light modulator array subsystem having a transmissive spatial light modulator array (2) and vertical stage means (9) for varying the position of the transmissive spatial light modulator array (2) so as to maintain the substrate region being exposed within depth of focus of the projection subsystem (6); and (e) control means (11) to operatively interrelate said stage subsystem (8), illumination subsystem (3), projection subsystem (6), and said spatial light modulator array subsystem (2) so as to position the substrate (1) for feature imaging, providing in repeated scans selective feature illumination, including additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate (1) is uniform.

2. A conformable, maskless microlithography system for patterning high-resolution features on large-area, nonplanar surfaces according to claim 1, further characterized in that (a) said illumination subsystem (3) has an effective source plane in the shape of a regular hexagon, and illuminates a regular-hexagon-shaped region on said mask (2), (b) said regular-hexagon-shaped illumination region on the virtual mask (2) is so oriented that two of its six sides are perpendicular to the scan direction;

(c) said projection subsystem (6) has an image field in the shape of a regular hexagon, and said regular-hexagon-shaped image field is so oriented that two of its six sides are perpendicular to the scan direction; and (d) the effective width, w, of each scan, as defined by the lateral separation between the center lines of two adjacent scans, is given by $$w = 1.5\, l_h,$$

where $l_h$ is the length of each side of said regular-hexagon-shaped illuminated region on the substrate (1).

3. A conformable, maskless microlithography system for patterning high-resolution features on large-area, nonplanar surfaces according to claim 1, further characterized in that said illumination subsystem (3) provides pulsed radiation from an excimer laser.

4. A conformable, high-resolution, maskless microlithography system for providing patterns from a virtual mask (2) onto a large-area photosensitive substrate (1) having a nonplanar surface. characterized by (a) a stage subsystem (8) for the substrate (1), said stage subsystem (8) comprising a substantially planar stage with a position for mounting said substrate (1), being capable of scanning in one dimension, and when not scanning in that dimension, capable of moving laterally in a direction perpendicular to the scan direction so as to position itself for another scan; said stage subsystem (8) thus being capable of exposing the full substrate (1) by breaking up the substrate area into a certain number of parallel strips, and exposing each of said strips by scanning the length of the strip across an illumination region;

(b) an illumination subsystem (3) having the wavelength and intensity distribution characteristics suited for exposure of an image field on said substrate (1), having an effective source plane of a predetermined shape, and capable of illuminating through a projection subsystem an image field of said predetermined shape on said substrate (1);

(c) a projection subsystem (6) for imaging said illuminated region of said predetermined shape onto the substrate, having a predetermined object-to-image magnification ratio, having the desired imaging and having an image field of said predetermined shape and of an area smaller than the substrate (1) area;

(d) a virtual mask (2) having a transmissive spatial light modulator array and vertical stage means (9) for repositioning said projection subsystem (6) and said transmissive spatial light modulator array subsystem (2) by an amount determined by the vertical position of the region being exposed on the surface of said substrate (1);

said virtual mask subsystem comprises linear vertical positioning stage means (9) essentially orthogonal to the surface of said stage subsystem (8), said vertical stage means (9)

(e) control means (11) to operatively interrelate said stage subsystem (8), illumination subsystem (3), projection subsystem (6), and said spatial light modulator array subsystem (2) so as to position the substrate (1) for feature imaging, providing in repeated scans selective feature illumination, inducing additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate (1) is uniform.

5. A conformable, maskless microlithography system for patterning high-resolution features on large-area, nonplanar surfaces according to claim 4, further characterized in that said transmissive spatial light modulator array (2) has a gimbal mount (22); and said control system (11) includes sensing means (10) for monitoring the vertical position of the illumination region on said surface of said substrate (1) so as to determine a sub-plane of approximate tangency and to control said spatial light modulator array (2) to parallelism with such sub-plane of approximate tangency;

whereby the optical beam path length remains approximately constant and the wavefront of the patterning beam approximates parallelism with such sub-plane of approximate tangency.

6. A conformable, maskless microlithography system for patterning high-resolution features on large-area, nonplanar surfaces according to claim 5, further characterized in that said transmissive spatial modulator array (2) is also segmented in such a way as to allow step-wise deformation of its surface profile and hence to provide a capability for adjustment of the optical wavefront emerging from the spatial light modulator;

whereby the wavefront of the image forming light is controlled to produce an image surface that is curved to match the substrate local curvature.

7. A conformable, maskless microlithography system for patterning high-resolution features on large-area, nonplanar surfaces according to claim 5, further characterized in that a flexmirror (41) is added and used as both a fold mirror and as a wavefront control element;

whereby the wavefront of the image forming light is controlled to produce an image surface that is curved to match the substrate local curvature.

8. A conformable, high-resolution, maskless microlithography system for providing patterns from a virtual mask (2) onto a large-area photosensitive substrate (1) having a nonplanar surface, characterized by (a) a stage subsystem (8) for the substrate (1), said stage subsystem (8) comprising a substantially planar stage with a position for mounting said substrate (1), being capable of scanning in one dimension, and when not scanning in that dimension, capable of moving laterally in a direction perpendicular to the scan direction so as to position itself for another scan; said stage subsystem (8) thus being capable of exposing the full substrate (1) by breaking up the substrate area into a certain number of parallel strips, and exposing each of said strips by scanning the length of the strip across an illumination region;

(b) an illumination subsystem (3) having the wavelength and intensity distribution characteristics suited for exposure of an image field on said substrate (1), having an effective source plane of a predetermined shape, and capable of illuminating through a projection subsystem an image field of said predetermined shape on said substrate (1);

(c) a protection subsystem (6) for imaging said illuminated region of said predetermined shape onto the substrate, having a predetermined object-to-image magnification ratio, having the desired imaging and having an image field of said predetermined shape and of an area smaller than the substrate (1) area;

(d) a virtual mask (2) having a reflective spatial light modulator array (51) and vertical stage means (9), essentially orthogonal to the surface of said stage subsystem (8), for varying the position of said reflective spatial light modulator so as to maintain the substrate region being exposed within depth of focus of the projection subsystem (6);

whereby said virtual mask subsystem and said vertical stage means (9) repositions said protection subsystem (6) and virtual mask (2) by an amount determined by the vertical position of the region being exposed on the surface of said substrate (1); and (e) control means (11) to operatively interrelate said stage subsystem (8), illumination subsystem (3), projection subsystem (6), and said spatial light modulator array subsystem (2) so as to position the substrate (1) for feature imaging, providing in repeated scans selective feature illumination, including additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate (1) is uniform.

9. A conformable, high-resolution, maskless microlithography system for providing patterns from a virtual mask (2) onto a large-area photosensitive substrate (1) having a nonplanar surface, characterized by (a) a stage subsystem (8) for the substrate (1), said stage subsystem (8) comprising a substantially planar stage with a position for mounting said substrate (1), being capable of scanning in one dimension, and when not scanning in that dimension, capable of moving laterally in a direction perpendicular to the scan direction so as to position itself for another scan; said stage subsystem (8) thus being capable of exposing the full substrate (1) by breaking up the substrate area into a certain number of parallel strips, and exposing each of said strips by scanning the length of the strip across an illumination region;

(b) an illumination subsystem (3) having the wavelength and intensity distribution characteristics suited for exposure of an image field on said substrate (1), having an effective source plane of a predetermined shape, and capable of illuminating through a projection subsystem an image field of said predetermined shape on said substrate (1);

(c) a projection subsystem (6) for imaging said illuminated region of said predetermined shape onto the substrate, having a predetermined object-to-image magnification ratio, having the desired imaging and having an image field of said predetermined shape and of an area smaller than the substrate (1) area;

(d) a virtual mask (2) having a segmented reflective spatial light modulator (61) and vertical stage means (9), essentially orthogonal to the surface of said stage subsystem (8), for varying the position of said reflective spatial light modulator so as to maintain the wavefront of the image forming light to produce an image surface that is curved to math the substrate local curvature, wherein said virtual mask subsystem and said vertical stage means (9) reposition said projection subsystem (6) and virtual mask (2) by an amount determined by the vertical position of the region being exposed on the surface of said substrate (1); and (e) control means (11) to operatively interrelate said stage subsystem (8), illumination subsystem (3), projection subsystem (6), and said spatial light modulator array subsystem (2) so as to position the substrate (1) for feature imaging, providing in repeated scans selective feature illumination, including additive illumination in certain overlap regions of areas exposed by adjacent scans such that (i) during exposure each substrate region is within the imaging depth of focus and (ii) the effect of the exposure dose delivered in said overlap regions is seamless and the effective exposure dose delivered across the entire substrate (1) is uniform.

* * * * *